(12) United States Patent
Kijima et al.

(10) Patent No.: US 6,563,691 B2
(45) Date of Patent: May 13, 2003

(54) MOUNTING STRUCTURE FOR CAPACITORS

(75) Inventors: Kenji Kijima, Tokyo (JP); Kihei Nakajima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/954,213

(22) Filed: Sep. 18, 2001

(65) Prior Publication Data

US 2002/0034059 A1 Mar. 21, 2002

(30) Foreign Application Priority Data

Sep. 18, 2000 (JP) ........................................ 2000-282196

(51) Int. Cl.⁷ ................................................ H01G 4/38
(52) U.S. Cl. .................... 361/328; 361/309; 361/306.1; 361/321.2
(58) Field of Search ............................... 361/328, 306.1, 361/308.1, 309, 321.2, 301.4, 306.2

(56) References Cited

U.S. PATENT DOCUMENTS

| | | | | |
|---|---|---|---|---|
| 4,442,473 A | * | 4/1984 | Holtzman et al. | ........ 361/275.4 |
| 5,493,259 A | * | 2/1996 | Blalock et al. | ............. 333/182 |
| 5,875,091 A | * | 2/1999 | Rieken | ........................ 361/328 |
| 6,101,114 A | | 8/2000 | Kijima et al. | |
| 6,191,933 B1 | * | 2/2001 | Ishigaki et al. | ............. 361/309 |
| 6,282,077 B1 | | 8/2001 | Kijima | |
| 6,310,759 B2 | * | 10/2001 | Ishigaki et al. | ............. 361/309 |

* cited by examiner

*Primary Examiner*—Anthony Dinkins
(74) *Attorney, Agent, or Firm*—Foley & Lardner

(57) ABSTRACT

The mounting structure has a plurality of unit capacitors (1) comprising ceramic capacitor elements (2) with terminals (3), (4), and a three-tier substrate (10) comprising an insulating layer (11) sandwiched between two electrodes (12), (13). A plurality of apertures (15) is formed in the first electrode, in which are positioned bosses (16) being continuous with the second electrode (13), while the plurality of unit capacitors (1) is arranged on the first electrode (12), one terminal of each unit capacitor (1) being in contact with the first electrode (12) and the other with the second electrode (13) via a boss (16) so as to connect all the unit capacitors (1) electrically in parallel fashion.

In this manner a mounting structure for capacitors is provided which permits of high capacity in a compact form.

1 Claim, 4 Drawing Sheets

MOUNTING STRUCTURE FOR CAPACITORS

CROSS-REFERENCE TO RELATED APPLICATION

This application claims benefit of priority to Japanese Application No. JP2000-282196 filed on Sep. 18, 2000, the entire content of which is incorporated by reference herein.

BACKGROUND OF THE INVENTION

1. Field of the Invention

The present invention relates to mounting structure for capacitors located, for instance, on a circuit comprising a power semiconductor device.

2. Description of the Related Art

Generally speaking, where a power semiconductor device is used as a switching device, the semiconductor device is provided with a snubber circuit or smoothing circuit including a capacitor.

In the case of a snubber circuit, the collector and emitter of the semiconductor device are provided with a series circuit with capacitor and diode to absorb surge voltage of the semiconductor device during switching.

With a smoothing circuit, it is generally provided on the input side of a three-phase inverter or other main switching circuit to control variations in voltage.

Inductance in a snubber circuit must be kept very low in order to reduce surge voltage. However, in high-capacity apparatus using high levels of current and voltage, increased capacitor size and length of wiring mean that it is difficult to reduce inductance.

Film capacitors (oil type or dry type) are in frequent use, and there is a limit to the extent to which they can be made more compact and inductance reduced.

In the case of smoothing circuits, film capacitors are used for high voltages, while electrolytic capacitors are used where the main circuit voltage is less than about 3 kV. The volume and lengthy wiring of the electrolytic capacitors used for medium and low voltages in particular make it difficult to reduce inductance, and increase the external dimensions of the equipment in which they are used.

Meanwhile, ceramic capacitors offer high permittivity and compact size. Moreover, the fact that they are sintered bodies gives them a freedom of structure, it is easy to achieve low inductance, and the inorganic nature of the material makes them non-combustible and stable. It also means that in order to achieve high capacity it is necessary to have a serial or parallel structure of unit capacities.

Recent advances have led to the realization of 1 kV/1 $\mu$F capacitors for use in snubber circuits and 600 V/10–1001 $\mu$F devices for use in smoothing circuits. Consequently, there is a demand for mounting structures which allow unit capacitors of this sort to be connected in serial or parallel fashion compactly and with low inductance.

SUMMARY OF THE INVENTION

Accordingly, one object of the present invention is to provide a novel mounting structure for capacitors which permits of high capacity in a compact form achieved by connected ceramic unit capacitors in serial or parallel fashion compactly and with low inductance.

With a view to fulfilling this object, the present invention is a mounting structure for capacitors having a plurality of unit capacitors comprising ceramic capacitor devices with pairs of positive and negative terminals, and a three-tier (layer) substrate comprising an insulating layer sandwiched between two electrodes, wherein a plurality of apertures is formed in the first electrode, in which are positioned bosses being continuous with the second electrode, while the plurality of unit capacitors are arranged on the first electrode, one terminal of each unit capacitor being in contact with the first electrode and the other with the second electrode via a boss so as to connect all the unit capacitors electrically in parallel fashion.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
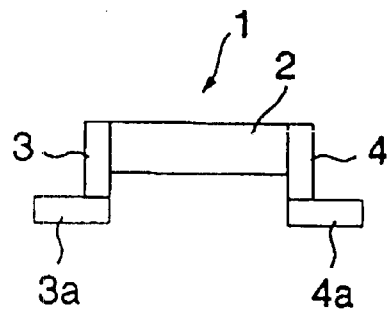
FIG. 1 is a side view of a unit capacitor illustrating an embodiment of the present invention.

With reference now to the drawings, wherein like reference numerals designate identical or corresponding parts throughout the several views, and more particularly to FIG. 1 thereof, one embodiment of the present invention will be described.

FIG. 1 shows a unit capacitor 1, which is manufactured by using a ceramic such as barium titanate to sinter a rectangular element 2. To either end of the element 2 are joined metallic positive and negative terminals 3 and 4.

The terminals 3 and 4 are flat in shape, and one end is formed into a foot member 3a and 4a for the purpose of connection.

Figure 2:
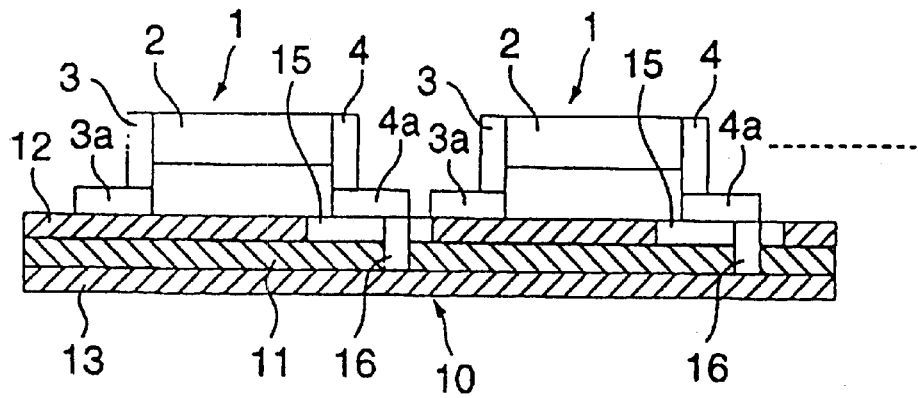
FIG. 2 is a cross-sectional view illustrating the mounting structure of that unit capacitor.

FIG. 2 illustrates a plurality of unit capacitors 1 mounted on a substrate 10. The substrate 10 comprises a three-tier structure wherein an insulating layer 11 is sandwiched between a first electrode 12 and a second electrode 13.

On the first electrode 12 is formed a plurality of apertures 15, which are arranged in the same direction. Meanwhile, bosses 16 are formed integrally with the second electrode 13 in sections corresponding to each of the apertures 15. Each of these bosses 16 penetrates the insulating layer 11 to protrude into the corresponding aperture 15, the upper surfaces of the bosses 16 being retained in the same plane as the upper surface of the first electrode 12.

All the unit capacitors 1 are arranged on the first electrode 12 in the same direction relative to the apertures 15. The foot members 3a of the positive terminals 3 of all the unit capacitors 1 are in contact with the first electrode 12, while the foot members 4a of the negative terminals 4 of all the unit capacitors 1 are in contact with the bosses 16 within the corresponding apertures 15. In this manner the positive terminals 3 of all the unit capacitors 1 are in continuity with each other via the first electrode 12, while the negative terminals 4 are in continuity with each other via the bosses 16 and the second electrode 13, and are thus connected electrically in parallel fashion.

All the terminals 3 and 4 of the unit capacitors are fixed to the first electrode 12 and bosses 16 by soldering or screwing.

In a structure of this sort it is possible to ensure high permittivity because the elements 2 of the unit capacitors 1 are ceramic, and to achieve compactness and low inductance because ceramic blocks are used as they are without any cases.

Moreover, because the structure is such that the first terminals 3 of all the unit capacitors 1 are fixed in contact with the first electrode 12 of the three-tier substrate 10 while the second terminals 4 are fixed in contact with the bosses 16 which are in continuity with the second electrode 13 so that all the unit capacitors 1 are connected in parallel fashion, it is possible to ensure low inductance of the wiring, and to change the capacity by increasing or decreasing the number of parallel unit capacitors 1.

The terminals 3 and 4 of the unit capacitors 1 are fixed to the first electrode 12 and bosses 16 by soldering or screwing. Soldering enables them to be surface-mounted, thus simplifying the manufacturing process, whereas screwing enhances their mechanical strength and resistance to heat cycles.

Figure 3:
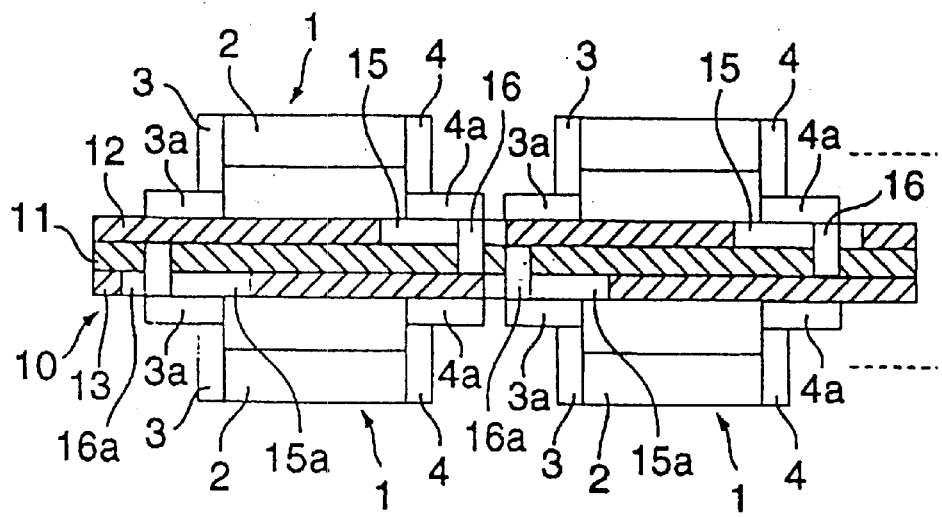
FIG. 3 is a cross-sectional view of the mounting structure illustrating a second embodiment.

FIG. 3 illustrates a second embodiment. Here a plurality of unit capacitors is arranged on either side of the three-tier substrate 10, thus connecting them in parallel fashion.

In other words, a plurality of unit capacitors 1 is arranged on the first electrode 12 of the substrate 10 as in the first embodiment. A plurality of apertures 15a arranged in the same direction is formed in the second electrode 13 on the lower side of the substrate 10, and a plurality of bosses 16a is formed integrally with the first electrode 12 in sections corresponding to each of the apertures 15a. Each of these bosses 16a penetrates the insulating layer 11 to protrude into the corresponding aperture 15a.

The foot members 3a of the positive terminals 3 of all the unit capacitors 1 on the lower side of the substrate 10 are fixed in contact with the bosses 16a, while the foot members 4a of the negative terminals 4 are in contact with the second electrode 13. In this manner all the unit capacitors 1 on both sides of the substrate 10 are connected electrically in serial fashion.

In this case also the same effect can be achieved as with the first embodiment, but in comparison with where the unit capacitors 1 are arranged on only one side of the electrode 10 it is possible in particular to increase their number and double the capacity. On the other hand, if the number of unit capacitors is kept the same, it is possible to halve the mounting area.

Figure 4:
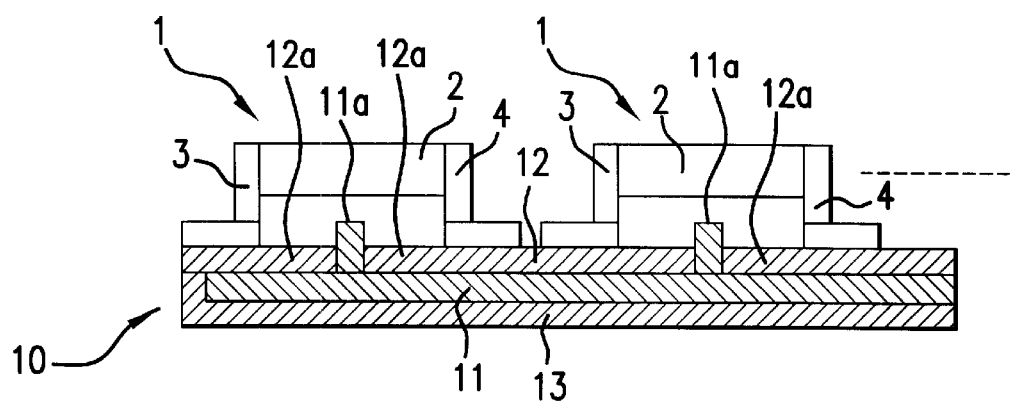
FIG. 4 is a cross-sectional view of the mounting structure illustrating a third embodiment.

FIG. 4 illustrates a third embodiment. In this embodiment, the first electrode 12 and second electrode 13 of the three-tier substrate 10 are in continuity with each other at one end, and the first electrode 12 is divided into a plurality of independent electrode zones 12a by means of a barrier 11a formed integrally with the insulating layer 11.

A plurality of unit capacitors 1 arranged in the same direction is provided on the first electrode 12 of the substrate 10. These unit capacitors are arranged so as to straddle the barriers 11a in succession, one terminal 3 being fixed in contact with the neighbouring electrode zone 12a from which it is divided by a barrier 11a while the other terminal 4 is fixed in contact with the other electrode zone 12a. In this manner all the unit capacitors 1 are connected electrically in serial fashion.

In a structure of this sort it is possible to achieve low inductance and compactness. It is also possible to set capacitor withstand voltage according to the thickness of the insulating layer and the number of serial unit capacitors 1.

By dividing the second electrode on the lower side of the substrate 10 into a plurality of capacitor zones also and fitting a plurality of unit capacitors there it is possible even with this serial connection to achieve a structure with enhanced capacity and withstand voltage.

Figure 5:
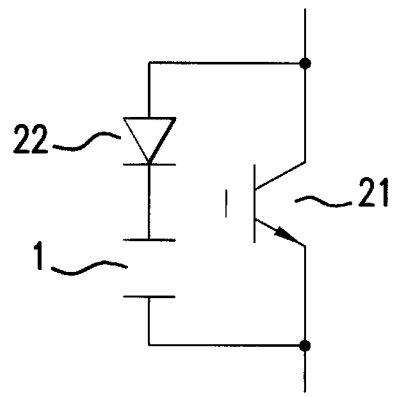
FIG. 5 is a snubber circuit diagram illustrating a fourth embodiment of the present invention.
Figure 6:
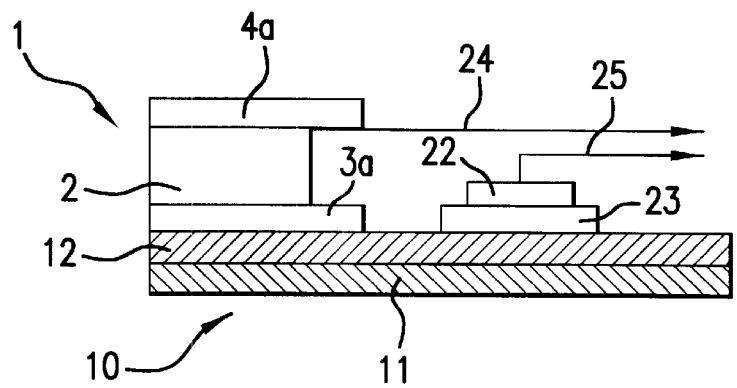
FIG. 6 is a cross-sectional view of the mounting structure of the snubber circuit.

FIGS. 5 and 6 illustrate a fourth embodiment, FIG. 5 being a snubber circuit and FIG. 6 the mounting structure thereof. This snubber circuit comprises a semiconductor device 21 which acts as a switching element, and a diode 22. A unit capacitor 1 and diode 22 are connected serially between the collector and emitter of the semiconductor device 21.

As may be seen from FIG. 6, the substrate 10 has an electrode 12 on top of an insulating layer 11, the unit capacitor 1 being positioned on the electrode 12 and comprising a ceramic element 2 with terminals 3 and 4 joined on either side.

To the electrode 12 of the substrate 10 in the vicinity of the unit capacitor 1 is attached a diode 22 by direct soldering using a low thermal expansion spacer 23 of molybdenum or a similar material. In other words, a small unit capacitor is provided in the vicinity of the diode in line with the pressure resistance of the device. The unit capacitor 1 is in continuity with the emitter of the semiconductor device 21 via the wiring 24, and the diode 22 with the collector of the semiconductor device 21 via the wiring 25 to form a structure wherein it is possible to suppress surge voltage in the semiconductor device 21 during switching (current change×circuit inductance).

The above structure permits of a compact snubber circuit with low inductance.

Figure 7:
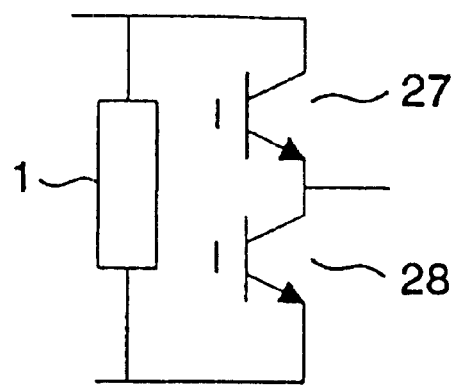
FIG. 7 is a smoothing circuit diagram illustrating a fifth embodiment of the present invention.
Figure 8:
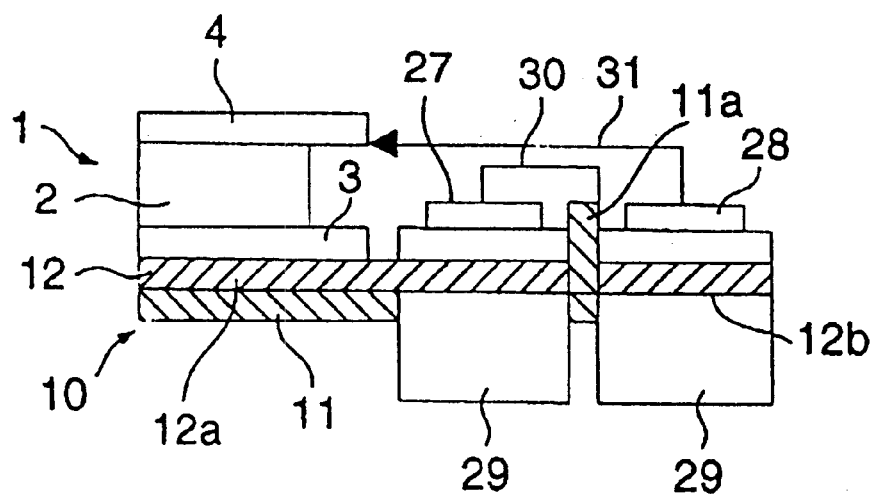
FIG. 8 is a cross-sectional view of the mounting structure of the smoothing circuit.

FIGS. 7 and 8 illustrate a fifth embodiment, FIG. 7 being a smoothing circuit and FIG. 8 the mounting structure thereof. This smoothing circuit comprises a pair of upper and lower switching elements 27, 28 and unit capacitor 1.

The unit capacitor 1 is attached to the top of the electrode 12 of the substrate 10, and the upper and lower switching devices 27, 28 are attached directly to the electrode 12 in the vicinity of the unit capacitor 1 by soldering. A heat sink 29 is attached to each of the switching devices 27 and 28.

The structure is such that the electrode 12 of the substrate 10 is divided by means of a barrier 11a into an electrode zone 12a comprising a unit capacitor 1 and the upper switching device 27, and an electrode zone 12b comprising the lower switching device 28. The upper switching device 27 is in continuity with the lower switching device 28 via wiring 30 and with the unit capacitor 1 via the electrode zone 12a, while the lower switching device 28 is in continuity with the unit capacitor 1 via wiring 31.

The above structure permits of a compact smoothing circuit with low inductance.

Figure 9:
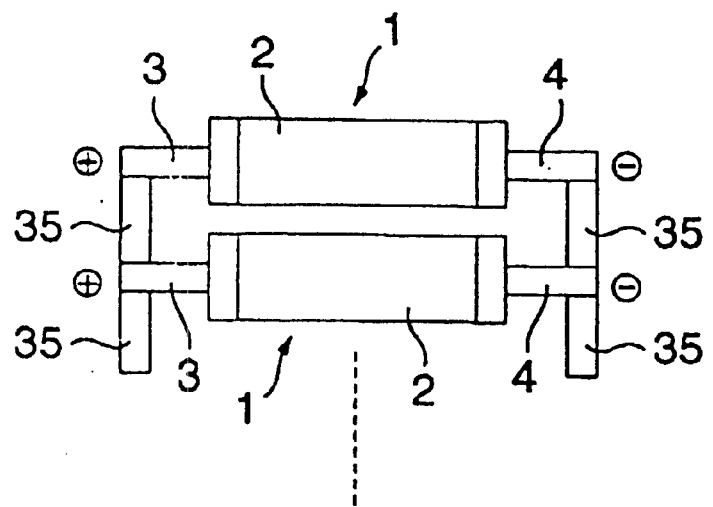
FIG. 9 is a cross-sectional view of the mounting structure illustrating a sixth embodiment.

FIG. 9 illustrates a sixth embodiment in which the ceramic devices 2 of the unit capacitors 1 are flat, having positive and negative terminals 3 and 4 respectively attached at either side and extending horizontally.

A plurality of unit capacitors 1 of this sort is stacked on top of one another, each of the respective positive terminals 3 and negative terminals 4 in the unit capacitors which face one another as a result of such stacking being joined electrically and mechanically by means of electrically conductive spacers 35 so that all the unit capacitors 1 are connected electrically in serial fashion.

The above structure makes it possible to obtain compact capacitors without the need to use wiring, the capacity being dependent on the number of unit capacitors 1.

Figure 10:
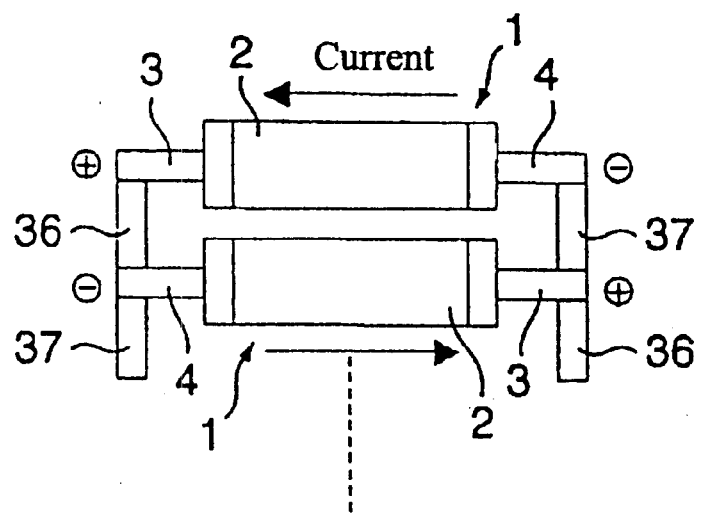
FIG. 10 is a cross-sectional view of the mounting structure illustrating a seventh embodiment.

FIG. 10 illustrates a seventh embodiment in which again the ceramic devices 2 of the unit capacitors 1 are flat, having positive and negative terminals 3 and 4 attached at either side and extending horizontally.

A plurality of unit capacitors 1 of this sort is stacked on top of one another. In this case the layers of unit capacitors 1 face alternately in opposite directions, the positive terminals 3 and negative terminals 4 of the unit capacitors facing one another alternately. In this condition, the positive and negative terminals 3 and 4 are joined layer by layer electrically and mechanically by means of electrically conductive spacers, while the negative and positive terminals 4, 3 are joined by means of insulating spacers so that all the unit capacitors 1 are connected electrically in serial fashion.

The above structure makes it possible to obtain compact capacitors without the need to use wiring, the capacity being dependent on the number of unit capacitors 1.

As will be clear from the above, the embodiments of the present invention facilitate the provision of a compact mounting structure by connecting ceramic unit capacitors with low inductance in a serial or parallel fashion.

Obviously, numerous additional modifications and variations of the present invention are possible in light of the above teachings. It is therefore to be understood that within the scope of the appended claims the present invention may be practised otherwise than as specifically described herein.

What is claimed is:

1. A mounting structure for capacitors having a plurality of unit capacitors, comprising:

ceramic capacitor devices with pairs of positive and negative terminals; and a substrate that fits said ceramic capacitor devices on said substrate, wherein terminals having different respective polarities are stacked facing each other, said terminals having different respective polarities on either side of each unit capacitor in each layer being connected layer by layer alternately by electrically conductive spacers and insulating spacers so as to connect each of said unit capacitors electrically in serial fashion.

* * * * *